United States Patent
Lee et al.

(10) Patent No.: US 9,208,950 B2
(45) Date of Patent: Dec. 8, 2015

(54) MULTILAYER CERAMIC CAPACITOR AND BOARD FOR MOUNTING THE SAME

(71) Applicant: SAMSUNG ELECTRO-MECHANICS CO., LTD., Suwon, Gyunggi-do (KR)

(72) Inventors: Byoung Hwa Lee, Gyunggi-do (KR); Young Ghyu Ahn, Gyunggi-do (KR); Sang Soo Park, Gyunggi-do (KR); Seok Kyoon Woo, Gyunggi-do (KR); Tae Hyeok Kim, Gyunggi-do (KR); Heung Kil Park, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/899,279

(22) Filed: May 21, 2013

(65) Prior Publication Data

US 2014/0185186 A1 Jul. 3, 2014

(30) Foreign Application Priority Data

Dec. 27, 2012 (KR) .......................... 10-2012-0154037

(51) Int. Cl.
*H01G 4/30* (2006.01)
*H01G 4/012* (2006.01)
(Continued)

(52) U.S. Cl.
CPC .................. *H01G 4/30* (2013.01); *H01G 2/065* (2013.01); *H01G 4/012* (2013.01); *H01G 4/232* (2013.01); *H05K 3/3442* (2013.01); *H05K 2201/10015* (2013.01)

(58) Field of Classification Search
CPC ......... H01G 4/30; H01G 4/232; H01G 4/012; H01G 2/065; H05K 1/182

USPC .................................. 361/303, 301.4, 321.2
See application file for complete search history.

(56) References Cited

U.S. PATENT DOCUMENTS 4,556,929 A * 12/1985 Tanaka et al. ............... 361/321.2
7,190,566 B2 * 3/2007 Tonogai et al. .............. 361/303
(Continued)

FOREIGN PATENT DOCUMENTS

JP          04171708 A  *  6/1992
JP          06069063 A  *  3/1994
(Continued)

OTHER PUBLICATIONS

Japanese Office Action issued in Japanese Application No. 2013-102818 dated Apr. 22, 2014, w/English translation.
(Continued)

*Primary Examiner* — David M Sinclair
(74) *Attorney, Agent, or Firm* — McDermott Will & Emery LLP

(57) ABSTRACT

There is provided a multilayer ceramic capacitor including: a ceramic body in which a plurality of dielectric layers are laminated; a plurality of first and second internal electrodes formed to be alternately exposed to both end surfaces of the ceramic body with the dielectric layer interposed therebetween; and first and second external electrodes covering both end surfaces of the ceramic body, wherein the ceramic body includes an active layer forming capacitance by including the plurality of first and second internal electrodes and a cover layer formed on an upper portion or a lower portion of the active layer, wherein the active layer includes a first block in which a first region I, and a second region II, and a second block in which a third region III, and a fourth region IV.

12 Claims, 4 Drawing Sheets

(51) Int. Cl.
*H01G 4/06* (2006.01)
*H01G 2/06* (2006.01)
*H01G 4/232* (2006.01)
*H05K 3/34* (2006.01)

(56) References Cited

U.S. PATENT DOCUMENTS

| | | | |
|---|---|---|---|
| 7,394,644 B2 * | 7/2008 | Kojima | 361/303 |
| 8,373,964 B2 * | 2/2013 | Ahn et al. | 361/301.4 |
| 2004/0240146 A1 | 12/2004 | Kayatani et al. | |
| 2008/0080121 A1 | 4/2008 | Togashi | |
| 2009/0002918 A1 | 1/2009 | Kawasaki et al. | |

FOREIGN PATENT DOCUMENTS

| | | | | |
|---|---|---|---|---|
| JP | 06163311 | A | * | 6/1994 |
| JP | 09266130 | A | * | 10/1997 |
| JP | 11312623 | A | * | 11/1999 |
| JP | 2003257785 | A | * | 9/2003 |
| JP | 2004-022859 | A | | 1/2004 |
| JP | 2008-091520 | A | | 4/2008 |
| JP | 2011108827 | A | * | 6/2011 |
| JP | 2012-104784 | A | | 5/2012 |
| JP | 2013-206966 | A | | 10/2013 |
| KR | 2009-0102120 | A | | 9/2009 |
| TW | 200426865 | A | | 12/2004 |
| WO | 2007/080852 | A1 | | 7/2007 |

OTHER PUBLICATIONS

Korean Office Action issued in Korean Application No. 10-2012-0154037 dated Feb. 27, 2014, with English translation.
Notice of Office Action JP Application No. 2013-102818 dated Dec. 10, 2013 with English translation.
Taiwanese Examination Report issued in Taiwanese Application No. 102116987 dated Aug. 22, 2014, w/English translation.

* cited by examiner

MULTILAYER CERAMIC CAPACITOR AND BOARD FOR MOUNTING THE SAME

CROSS-REFERENCE TO RELATED APPLICATIONS

This application claims the priority of Korean Patent Application No. 10-2012-0154037 filed on Dec. 27, 2012, in the Korean Intellectual Property Office, the disclosure of which is incorporated herein by reference.

BACKGROUND OF THE INVENTION

1. Field of the Invention

The present invention relates to a multilayer ceramic capacitor and a board for mounting a multilayer ceramic capacitor.

2. Description of the Related Art

A multilayer ceramic capacitor, a laminated chip electronic component, is a chip-type condenser installed on a printed circuit board (PCB) of various electronic products such as image display devices (or video apparatuses) such as liquid crystal displays (LCDs), plasma display panels (PDPs), and the like, computers, smartphones, portable phones, and the like, to charge and discharge electricity.

A multilayer ceramic capacitor (MLCC), having advantages such as compactness, guaranteed high capacitance, and ease of mountability, may be used as components in various electronic devices.

An MLCC may include a plurality of dielectric layers and internal electrodes, having a structure in which internal electrodes having different polarities are alternately laminated between the dielectric layers.

The dielectric layers may have piezoelectric and electrostrictive properties. Thus, when a DC or an AC voltage is applied to an MLCC, a piezoelectric phenomenon occurs between internal electrodes, generating vibrations.

Vibrations may be transferred to a PCB on which the MLCC is mounted, through solders of the MLCC, inducing the entirety of the PCB to become an acoustically radiating surface to generate vibratory sound as noise.

Vibratory sound may correspond to an audio frequency within the range of 20 Hz to 2000 Hz, making users uncomfortable, and such a vibrating sound, which may cause discomfort to users, is known as acoustic noise.

An internal structure for MLCCs is yet to be studied further to reduce acoustic noise.

RELATED ART DOCUMENT (Patent document 1) Japanese Patent Laid Open Publication No. 2008-091520

SUMMARY OF THE INVENTION

An aspect of the present invention provides a multilayer ceramic capacitor (MLCC) and a board for allowing an MLCC to be mounted thereon.

According to an aspect of the present invention, there is provided a multilayer ceramic capacitor including: a ceramic body in which a plurality of dielectric layers are laminated; a plurality of first and second internal electrodes formed to be alternately exposed to both end surfaces of the ceramic body with the dielectric layer interposed therebetween; and first and second external electrodes covering both end surfaces of the ceramic body, wherein the ceramic body includes an active layer forming capacitance by including the plurality of first and second internal electrodes and a cover layer formed on an upper portion or a lower portion of the active layer, wherein the active layer includes a first block in which a first region I, formed to one side based on a central portion R of the ceramic body in the length direction in the length-thickness (L-T) cross-section of the ceramic body and including internal electrodes having different polarities facing one another in a lamination direction to form capacitance, and a second region II, including internal electrodes having the same polarity disposed in the lamination direction so as to not form capacitance, and a second block in which a third region III, formed on the other side based on the central portion R of the ceramic body in the length direction, facing the first region I in the length direction of the ceramic body, and including internal electrodes having the same polarity facing one another in the lamination direction so as to not form capacitance, and a fourth region IV, facing the second region II in the length direction of the ceramic body and including internal electrodes having different polarities facing one another in the lamination direction to form capacitance.

In the central portion R of the ceramic body in the length direction, internal electrodes having different polarities may face one another in the lamination direction to form capacitance.

A plurality of first blocks and a plurality of second blocks may be alternately laminated.

A thickness of the dielectric layer may be equal to or less than 1.8 μm.

A lamination amount of the dielectric layers may be equal to or less than 200 layers.

When a voltage is applied, the regions of the first and second external electrodes corresponding to the length direction of the ceramic body may contract in an inward direction of the ceramic body in the first region I and the fourth region IV.

When a voltage is applied, the regions of the first and second external electrodes corresponding to the length direction of the ceramic body may expand in an outward direction of the ceramic body in the second region II and the third region III.

According to another aspect of the present invention, there is provided a board for allowing a multilayer ceramic capacitor (MLCC) to be mounted thereon, including: a printed circuit board (PCB) having first and second electrode pads formed thereon; and an MLCC installed on the PCB, wherein the MLCC includes a ceramic body in which a plurality of dielectric layers are laminated, a plurality of first and second internal electrodes formed to be alternately exposed to both end surfaces of the ceramic body with the dielectric layer interposed therebetween, and first and second external electrodes formed on both end surfaces of the ceramic body and connected to the first and second electrode pads by solders, wherein the ceramic body includes an active layer forming capacitance by including the plurality of first and second internal electrodes and a cover layer formed on an upper portion or a lower portion of the active layer, wherein the active layer includes a first block in which a first region I, formed to one side based on a central portion R of the ceramic body in the length direction in the length-thickness (L-T) cross-section of the ceramic body and including internal electrodes having different polarities facing one another in a lamination direction to form capacitance and a second region II, including internal electrodes having the same polarity disposed in the lamination direction so as to not form capacitance, and a second block in which a third region III, formed on the other side based on the central portion R of the ceramic body in the length direction, facing the first region I in the length direction of the ceramic body, and including internal electrodes having the same polarity facing one another in the lamination direction so as to not form capacitance, and a fourth region IV facing the second region II in the length direction of the ceramic body and including internal electrodes having different polarities facing one another in the lamination direction to form capacitance.

In the central portion R of the ceramic body in the length direction, internal electrodes having different polarities may face one another in the lamination direction to form capacitance.

A plurality of first blocks and a plurality of second blocks may be alternately laminated.

A thickness of the dielectric layer may be equal to or less than 1.8 μm.

A lamination amount of the dielectric layers may be equal to or less than 200 layers.

When a voltage is applied, the regions of the first and second external electrodes corresponding to the length direction of the ceramic body may contract in an inward direction of the ceramic body in the first region I and the fourth region IV.

When a voltage is applied, the regions of the first and second external electrodes corresponding to the length direction of the ceramic body may expand in an outward direction of the ceramic body in the second region II and the third region III.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
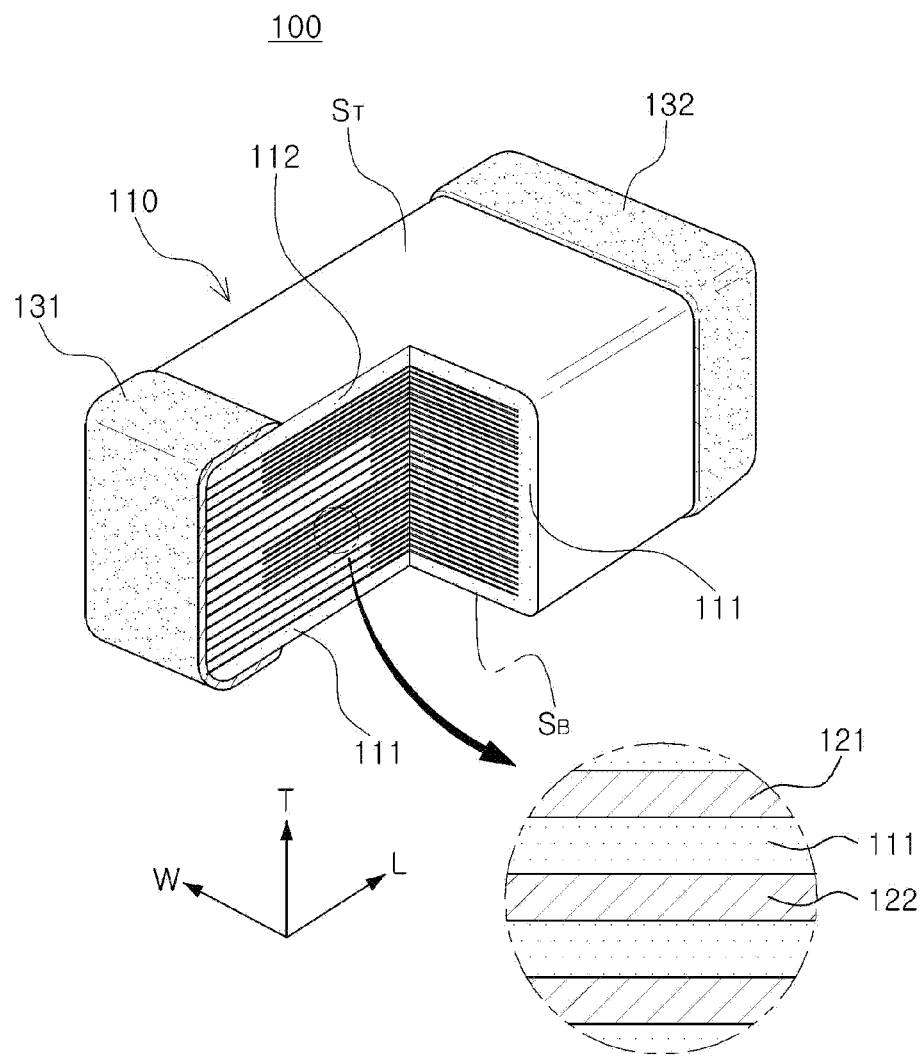
FIG. 1 is a schematic partially cutaway perspective view of a multilayer ceramic capacitor (MLCC) according to an embodiment of the present invention.

Embodiments of the present invention will now be described in detail with reference to the accompanying drawings.

The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like components.

Also, elements having the same function within a scope of the same concept illustrated in drawings of respective embodiments will be described by using the same reference numerals.

In order to clarify embodiments of the present invention, directions of the hexahedron may be defined as follows: L, W, and T indicated in FIG. 1 denote a length direction, a width direction, and a thickness direction, respectively. Here, the thickness direction may be used to have the same concept as that of a lamination direction in which the dielectric layers are laminated.

Also, in the present embodiment, for the purposes of description, surfaces on which first and second external electrodes are formed in a length direction of the ceramic body are set as horizontal end surfaces and surfaces perpendicular thereto are set as left and right lateral surfaces.

Also, an upper surface of the ceramic body on which an upper cover layer is formed is referred to as $S_T$, and a lower surface thereof on which a lower cover layer is formed is referred to as $S_B$.

Embodiments of the present invention will be described with reference to the accompanying drawings.

FIG. 1 is a schematic partially cutaway perspective view of a multilayer ceramic capacitor (MLCC) according to an embodiment of the present invention.

Figure 2:
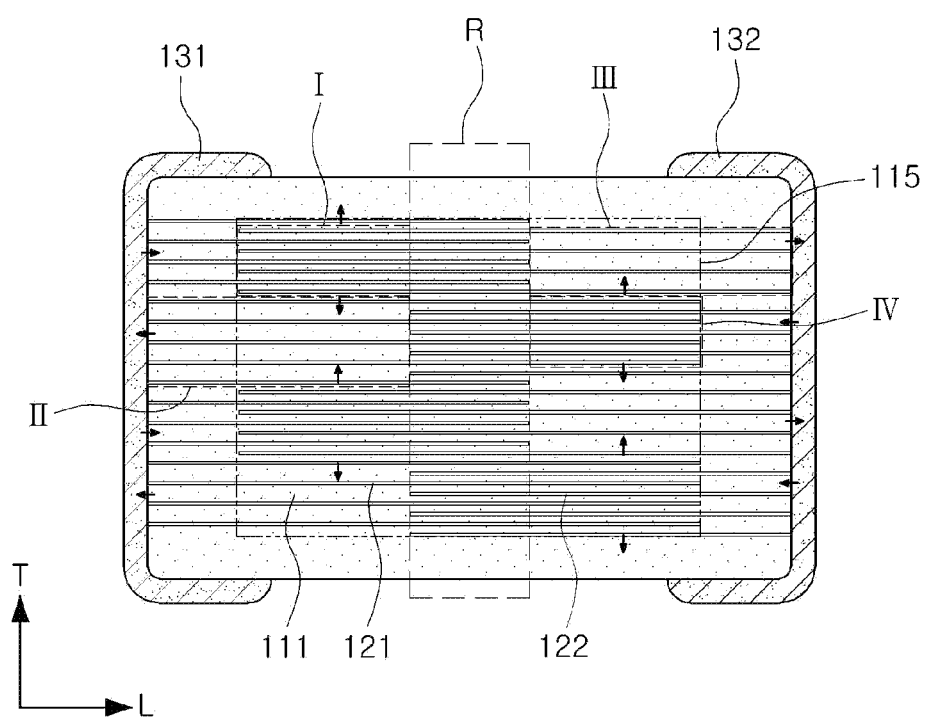
FIG. 2 is a cross-sectional view of the MLCC of FIG. 1 taken in a length-thickness direction.

FIG. 2 is a cross-sectional view of the MLCC of FIG. 1 taken in a length-thickness direction.

Referring to FIGS. 1 and 2, an MLCC 100 according to an embodiment of the present invention may include a ceramic body 110, an active layer 115 having first and second internal electrodes 121 and 122, upper and lower cover layers 112 and 113, and first and second external electrodes 131 and 132 covering both end surfaces of the ceramic body 110.

The ceramic body 110 is formed by laminating a plurality of dielectric layers 111 and subsequently firing the same, and a configuration and dimensions of the ceramic body 110 and a lamination amount of the dielectric layers 111 are not limited to those illustrated in the present embodiment.

Also, the plurality of dielectric layers 111 forming the ceramic body 110 are in a sintered state and adjacent dielectric layers 50 may be integrated such that boundaries therebetween may not be readily apparent without the use of a scanning electron microscope (SEM).

The ceramic body 110 may include the active layer 115 as a portion contributing to formation of capacitance of the capacitor and upper and lower layers 112 and 113, as margin portions, formed on upper and lower portions of the active layer 115.

The active layer 115 may be formed by iteratively laminating the first and second internal electrodes 121 and 122 with the dielectric layer 115 interposed therebetween, and the plurality of first and second external electrodes 131 and 132 may be disposed vertically on upper and lower surfaces of the ceramic body 110.

Here, a thickness of the dielectric layer 111 may be arbitrarily changed according to design of capacitance of the MLCC 100. Preferably, a thickness of one dielectric layer 111 may range from 0.1 μm to 10.0 μm after a firing operation, but the present invention is not limited thereto.

Also, the dielectric layer 111 may be made of ceramic powder having high dielectric constant (or high K-dielectrics), e.g., a barium titanate ($BaTiO_3$)-based powder, a strontium titanate ($SrTiO_3$)-based powder, but the present invention is not limited thereto.

The upper and lower cover layers 112 and 123 may be made of the same material and have the same configuration as those of the dielectric layer 111, except that they do not include an internal electrode.

The upper and lower cover layers 112 and 123 may be formed by laminating a single dielectric layer or two or more dielectric layers on upper and lower surfaces of the active layer 115, and basically serve to prevent damage to the first and second internal electrodes 121 and 122 due to physical or chemical stress.

Meanwhile, the first and second internal electrodes 121 and 122, a pair of electrodes having different polarities, may be formed by printing a conductive paste including a conductive metal to have a predetermined thickness.

Also, the first and second internal electrodes 121 and 122 may be alternately exposed to both end surfaces in a lamination direction of the dielectric layers 111, and may be electrically insulated from one another by the dielectric layer 111 disposed therebetween.

Namely, the first and second internal electrodes 121 and 122 may be electrically connected to the first and second external electrodes 131 and 132 through portions thereof alternately exposed to both end surfaces of the ceramic body 110.

Thus, during the application of voltage to the first and second external electrodes 131 and 132, charges are accumulated between the mutually facing first and second internal electrodes 121 and 122 and, here, capacitance of the MLCC 100 is proportional to an area of a mutually overlap region of the first and second internal electrodes 121 and 122.

Also, the first and second external electrodes 131 and 132 may be disposed vertically on the upper and lower surfaces of the ceramic body 110.

Thus, as described hereinafter, when the MLCC is mounted on a printed circuit board (PCB), acoustic noise can be reduced.

A thickness of the first and second internal electrodes may be determined according to purposes. For example, a thickness of the first and second internal electrodes may be determined to range from 0.2 μm to 1.0 μm, but the present invention is not limited thereto.

Also, a conductive metal included in the conductive paste forming the first and second internal electrodes 121 and 122 may be nickel (Ni), copper (Cu), palladium (Pd), or an alloy thereof, but the present invention is not limited thereto.

Also, the conductive paste may be printed by using a screening method, a gravure printing method, or the like, but the present invention is not limited thereto.

Meanwhile, the first and second external electrodes 131 and 132 may be made of a conductive paste including a conductive metal, and the conductive metal may be nickel (Ni), copper (Cu), palladium (Pd), gold (Au), or an alloy thereof, but the present invention is not limited thereto.

Referring to FIG. 2, the ceramic body 110 include the active layer 115 forming capacitance by including the plurality of first and second internal electrodes 121 and 122 and cover layers 112 and 113 formed on upper and lower portions of the active layer 115. The active layer 115 may include a first block in which a first region I, formed to one side based on a central portion R of the ceramic body 110 in the length direction in the length-thickness (L-T) cross-section of the ceramic body 110 and including internal electrodes having different polarities facing one another in a lamination direction to form capacitance and a second region II, including internal electrodes having the same polarity disposed in the lamination direction so as to not form capacitance, and a second block in which a third region III, formed on the other side based on the central portion R of the ceramic body 110 in the length direction, facing the first region I in the length direction of the ceramic body 110, and including internal electrodes having the same polarity facing one another in the lamination direction so as to not form capacitance, and a fourth region IV facing the second region II in the length direction of the ceramic body 110 and including internal electrodes having different polarities facing one another in the lamination direction to form capacitance.

According to an embodiment of the present invention, in the central portion R of the ceramic body 110 in the length direction, internal electrodes having different polarities may face one another in the lamination direction to form capacitance, but the present invention is not limited thereto.

A plurality of first blocks and a plurality of second blocks may be alternately laminated, but the present invention is not limited thereto.

In the first block, the first region I, formed to one side based on the central portion R of the ceramic body 110 in the length direction in the length-thickness (L-T) cross-section of the ceramic body 110 and including internal electrodes having different polarities facing one another in a lamination direction to form capacitance and the second region II including internal electrodes having the same polarity disposed in the lamination direction so as to not form capacitance may be disposed in the lamination direction.

The first region I in which internal electrodes having different polarities face one another in the lamination direction may be referred to as a region in which the first and second internal electrodes 121 and 122 are alternately laminated to form capacitance.

The second region II, in which internal electrodes having the same polarity face one another in the lamination direction, may be referred to as a region in which the first internal electrodes 121 or the second internal electrodes 122 are laminated in a facing manner so as to not form capacitance.

In this manner, the first region I and the second region II are disposed in the lamination direction, and the third region III, formed in the other side based on the central portion R of the ceramic body 110 in the length direction, facing the first region I in the length direction of the ceramic body 110, and including internal electrodes having the same polarity facing one another in the lamination direction so as to not form capacitance, and the fourth region IV facing the second region II in the length direction of the ceramic body 110 and including internal electrodes having different polarities facing one another in the lamination direction to form capacitance are disposed in the lamination direction, obtaining an excellent effect of reducing acoustic noise when the MLCC 100 is mounted on a printed circuit board (PCB).

Namely, since the first and second blocks are disposed on both sides of the ceramic body 110 based on the central portion R of the ceramic body 110 in the length direction in which the internal electrodes having different polarities face one another in the lamination direction to form capacitance, overlap regions may be dispersed, obtaining an effect of reducing acoustic noise when the MLCC is mounted on a PCB.

A thickness of the dielectric layer 111 may be 1.8 μm or less, but the present invention is not limited thereto.

According to an embodiment of the present invention, in comparison to a case in which the thickness of the dielectric layer 111 exceeds 1.8 μm, when the thickness of the dielectric layer 111 is equal to or less than 1.8 μm, acoustic noise may be more problematic in the case that the MLCC including such dielectric layers 111 is mounted on a PCB.

Also, a lamination amount of the dielectric layers 111 is not particularly limited. For example, the dielectric layers 111 may be two hundred or more layers, but the present invention is not limited thereto.

According to an embodiment of the present invention, in comparison to a case in which a lamination amount of the dielectric layers 111 is less than 200 layers, when the lamination amount of the dielectric layers 111 is 200 or more layers, acoustic noise may be more problematic when the MLCC including the lamination amount of dielectric layers is mounted on a PCB.

The effect of reducing acoustic noise when the MLCC is mounted on a PCB by dispersing the overlap regions of the internal electrodes will be described in more detail with reference to FIG. 2.

When different voltages having different polarities are applied to the first and second external electrodes 131 and 132 formed on both end portions of the MLCC 100, an overlap region in which the internal electrodes overlap and a non-overlap region in which the internal electrodes do not overlap show different aspects of contraction and expansion.

Namely, in the overlap region in which the internal electrodes overlap, the internal electrodes expand in the thickness direction of the ceramic body 110, and the internal electrodes in the non-overlap region contract.

Thus, according to an embodiment of the present invention, expansion takes place in the first region I and the fourth region IV as regions in which the internal electrodes overlap and contraction takes place in the second region II and the third region III as regions in which the internal electrodes does not overlap.

In this case, regions of the first and second external electrodes 131 and 132 corresponding to the first region I and the fourth region IV in the length direction of the ceramic body 110 in which expansion takes place, contract in an inward direction of the ceramic body 110.

Also, regions of the first and second external electrodes 131 and 132 corresponding to the second region II and the third region III in the length direction of the ceramic body 110 in which contraction takes place, expands in an outward direction of the ceramic body 110.

Referring to FIG. 2, as a result, contraction and expansion alternately take place in respective regions of the first and second external electrodes 131 and 132 in the width direction of the ceramic body 110.

Due to the contraction and expansion of the regions of the first and second external electrodes 131 and 132, an influence of acoustic noise that may be generated when the MLCC is mounted on a PCB can be minimized.

Meanwhile, referring to FIG. 2, as for the corresponding regions of the first and second external electrodes 131 and 132 in the length direction of the ceramic body 110, when the first external electrode 131 expands, the second external electrode 132 contracts, and when the first external electrode 131 contracts, the second external electrode 132 expands.

As a result, when the MLCC is mounted on a PCB, since the corresponding regions of the first and second external electrodes 131 and 132 expand and contract complementarily in the length direction of the ceramic body 110, influences of expansion and contraction of the first and second external electrodes that may generate acoustic noise are canceled out, thus reducing acoustic noise.

Experimental Example

Multilayer ceramic capacitors (MLCC) according to embodiments of the present invention and comparative examples were fabricated as follows.

The MLCCs according to the Examples were manufactured through the following steps.

First, slurry including powder formed of a material such as barium titanate ($BaTiO_3$), or the like, was applied to a carrier film and then dried to prepare a plurality of ceramic green sheets having a thickness of 1.8 μm.

Next, internal electrodes were formed by applying a conductive paste for a nickel internal electrode on the ceramic green sheets by using a screen.

About three hundreds and seventy (370) ceramic green sheets were laminated, and here, a larger number of ceramic green sheets without an internal electrode were laminated below ceramic green sheets with an internal electrode formed thereon than those above the ceramic green sheets with an internal electrode formed thereon. The laminate (or lamination body) was isostatically-pressed under pressure conditions of 1000 kgf/cm$^2$ at 85° C. The pressing-completed ceramic laminate was severed into individual chips, and a debinding process was performed by maintaining the individual chips at 230° C. for 60 hours under an air atmosphere.

Thereafter, the chips were fired at an oxygen partial pressure of $10^{-11}$ atm~$10^{-10}$ atm, lower than a Ni/NiO equilibrium oxygen partial pressure, under a reduced atmosphere such that the internal electrodes were not oxidized. After the firing operation, a chip size (length×width (L×W)) of a laminated chip capacitor was 1.64 mm×0.88 mm (L×W, 1608 size). Here, a fabrication tolerance was determined to be ±0.1 mm in length×width, and acoustic noise of a chip satisfying the fabrication tolerance was measured in the experimentation.

Thereafter, the chip was subjected to processes such as an external electrode formation process, a plating process, and the like, to fabricate an MLCC.

Board for Mounting MLCC

Figure 3:
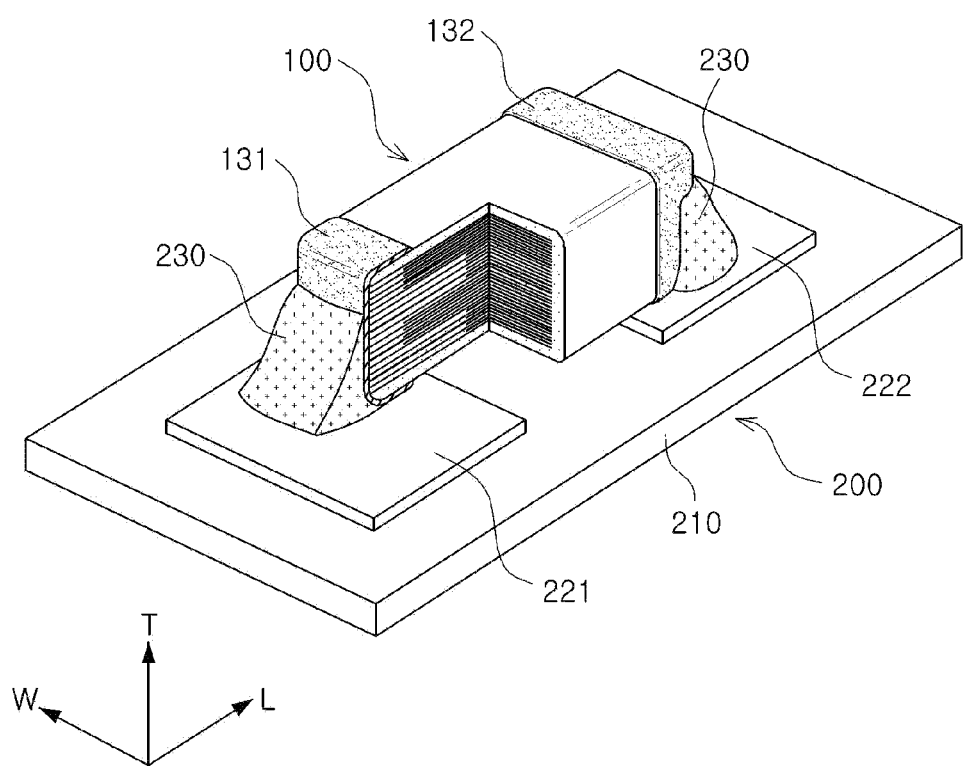
FIG. 3 is a perspective view illustrating the MLCC of FIG. 1 mounted on a printed circuit board (PCB)
Figure 4:
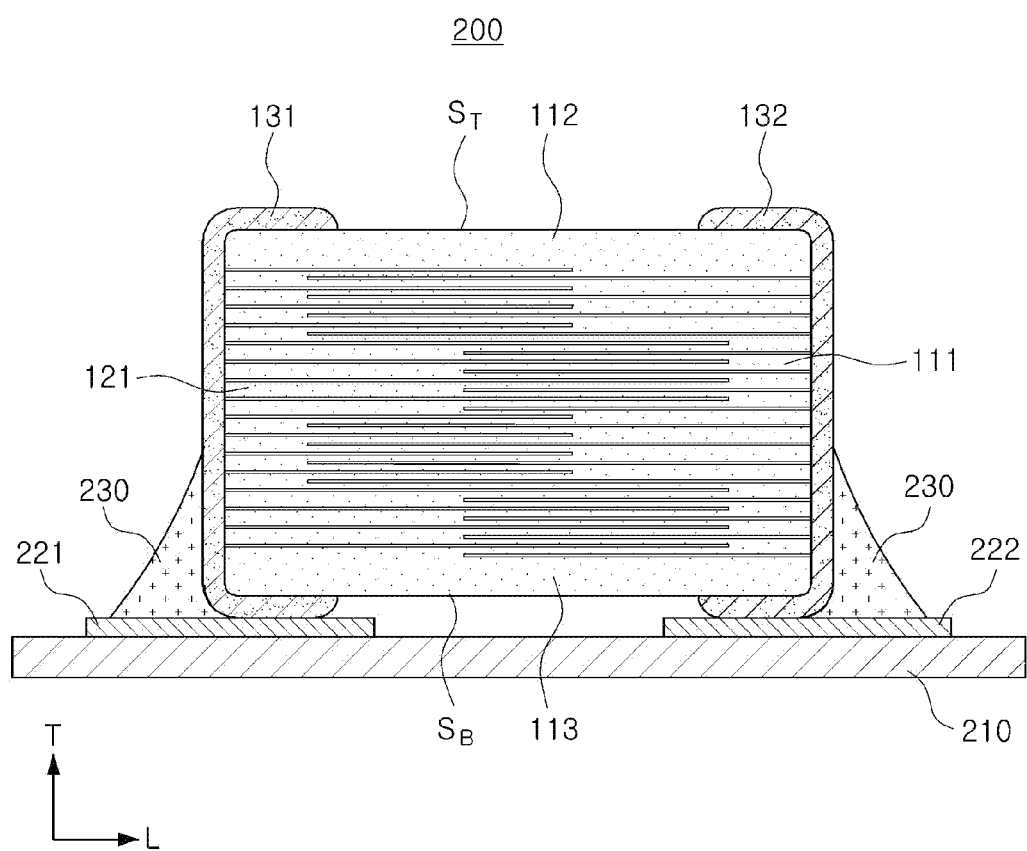
FIG. 4 is a cross-sectional view of the MLCC and PCB of FIG. 3 taken in the length direction.

Referring to FIGS. 3 and 4, a mounting board 200 of the MLCC 100 according to the present embodiment may include a PCB 210 on which the MLCC 10 is horizontally mounted and first and second electrode pads 221 and 222 formed to be spaced apart from one another on an upper surface of the PCB 210.

Here, in a state that the lower cover layer 113 of the MLCC 100 is disposed at the bottom and the first and second external electrodes 131 and 132 are in contact with the first and second electrode pads 221 and 222 on the first and second electrodes 221 and 222, the MLCC 100 may be electrically connected to the PCB 210 by solders 230.

In the state that the MLCC 100 is mounted on the PCB 210, during the application of voltage, acoustic noise may be generated.

Here, the size of the first and second electrode pads 221 and 222 may be an indicator for determining an amount of the solder 230 connecting the first and second external electrodes 131 and 132 and the first and second electrode pads 221 and 222, and a magnitude of acoustic noise may be regulated according to an amount of the solder 230.

Thus, as in the present embodiment, when the active layer 115 include the first block in which the first region I, formed to one side based on a central portion R of the ceramic body 110 in the length direction in the length-width (L-W) cross-section of the ceramic body 110 and including internal electrodes having different polarities facing one another in a lamination direction to form capacitance and the second region II, including internal electrodes having the same polarity disposed in the lamination direction so as to not form capacitance, and a second block in which a third region III, formed on the other side based on the central portion R of the ceramic body 110 in the length direction, facing the first region I in the length direction of the ceramic body 110, and including internal electrodes having the same polarity facing one another in the lamination direction so as to not form capacitance, and a fourth region IV facing the second region II in the length direction of the ceramic body 110 and including internal electrodes having different polarities facing one another in the lamination direction to form capacitance, acoustic noise can be further reduced.

As set forth above, according to embodiments of the present invention, vibrations generated in the MLCC are reduced, and thus, when the MLCC is mounted on a PCB, acoustic noise can be reduced.

Also, according to an embodiment of the present invention, the internal electrodes are laminated such that a capacitance formation part and a non-capacitance formation part are disposed to face one another in a length-width direction of the ceramic body, thus obtaining excellent acoustic noise reducing effect.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor comprising:
a ceramic body in which a plurality of dielectric layers are laminated;
a plurality of first and second internal electrodes formed to be alternately exposed to both end surfaces of the ceramic body with the dielectric layer interposed therebetween; and
first and second external electrodes covering both end surfaces of the ceramic body,
wherein the ceramic body includes an active layer forming capacitance by including the plurality of first and second internal electrodes and a cover layer formed on an upper portion or a lower portion of the active layer, wherein the active layer includes a first block in which a first region I, formed to one side based on a central portion R of the ceramic body in the length direction in the length-thickness (L-T) cross-section of the ceramic body and including internal electrodes having different polarities facing one another in a lamination direction to form capacitance and a second region II, including internal electrodes having the same polarity disposed in the lamination direction so as to not form capacitance, and a second block in which a third region III, formed on the other side based on the central portion R of the ceramic body in the length direction, facing the first region I in the length direction of the ceramic body, and including internal electrodes having the same polarity facing one another in the lamination direction so as to not form capacitance, and a fourth region IV facing the second region II in the length direction of the ceramic body and including internal electrodes having different polarities facing one another in the lamination direction to form capacitance,
wherein longitudinal end portions of the internal electrodes having same polarity in the first region I are on the same level, and longitudinal end portions of the internal electrodes having same polarity in the fourth region IV are on the same level, and
wherein a plurality of first blocks and a plurality of second blocks are alternately laminated.

2. The multilayer ceramic capacitor of claim 1, wherein in the central portion R of the ceramic body in the length direction, internal electrodes having different polarities face one another in the lamination direction to form capacitance.

3. The multilayer ceramic capacitor of claim 1, wherein a thickness of the dielectric layer is equal to or less than 1.8 µm.

4. The multilayer ceramic capacitor of claim 1, wherein a lamination amount of the dielectric layers is equal to or more than 200 layers.

5. The multilayer ceramic capacitor of claim 1, wherein when a voltage is applied, the regions of the first and second external electrodes corresponding to the length direction of the ceramic body contract in an inward direction of the ceramic body in the first region I and the fourth region IV.

6. The multilayer ceramic capacitor of claim 1, wherein when a voltage is applied, the regions of the first and second external electrodes corresponding to the length direction of the ceramic body expand in an outward direction of the ceramic body in the second region II and the third region III.

7. A board for allowing a multilayer ceramic capacitor (MLCC) to be mounted thereon, the board comprising:
a printed circuit board (PCB) having first and second electrode pads formed thereon; and
an MLCC installed on the PCB,
wherein the MLCC includes a ceramic body in which a plurality of dielectric layers are laminated, a plurality of first and second internal electrodes formed to be alternately exposed to both end surfaces of the ceramic body with the dielectric layer interposed therebetween, and first and second external electrodes formed on both end surfaces of the ceramic body and connected to the first and second electrode pads by solders, wherein the ceramic body includes an active layer forming capacitance by including the plurality of first and second internal electrodes and a cover layer formed on an upper portion or a lower portion of the active layer, wherein the active layer includes a first block in which a first region I, formed to one side based on a central portion R of the ceramic body in the length direction in the length-thickness (L-T) cross-section of the ceramic body and including internal electrodes having different polarities facing one another in a lamination direction to form capacitance and a second region II, including internal electrodes having the same polarity disposed in the lamination direction so as to not form capacitance, and a second block in which a third region III, formed on the other side based on the central portion R of the ceramic body in the length direction, facing the first region I in the length direction of the ceramic body, and including internal electrodes having the same polarity facing one another in the lamination direction so as to not form capacitance, and a fourth region IV facing the second region II in the length direction of the ceramic body and including internal electrodes having different polarities facing one another in the lamination direction to form capacitance,
wherein longitudinal end portions of the internal electrodes having same polarity in the first region I are on the same level, and longitudinal end portions of the internal electrodes having same polarity in the fourth region IV are on the same level, and
wherein a plurality of first blocks and a plurality of second blocks are alternately laminated.

8. The board of claim 7, wherein in the central portion R of the ceramic body in the length direction, internal electrodes having different polarities face one another in the lamination direction to form capacitance.

9. The board of claim 7, wherein a thickness of the dielectric layer is equal to or less than 1.8 µm.

10. The board of claim 7, wherein a lamination amount of the dielectric layers is equal to or more than 200 layers.

11. The board of claim 7, wherein when a voltage is applied, the regions of the first and second external electrodes corresponding to the length direction of the ceramic body contract in an inward direction of the ceramic body in the first region I and the fourth region IV.

12. The board of claim 7, wherein when a voltage is applied, the regions of the first and second external electrodes corresponding to the length direction of the ceramic body expand in an outward direction of the ceramic body in the second region II and the third region III.

* * * * *